(12) United States Patent
DeMoss

(10) Patent No.: US 11,445,642 B1
(45) Date of Patent: Sep. 13, 2022

(54) THERMAL CONTROL WITH OPERATING POINT SHIFT FOR ACOUSTIC OPTIMIZATION

(71) Applicant: DELL PRODUCTS, LP, Round Rock, TX (US)

(72) Inventor: Jeffrey J. DeMoss, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/228,509

(22) Filed: Apr. 12, 2021

(51) Int. Cl.
| G06F 1/16 | (2006.01) |
| H05K 5/00 | (2006.01) |
| H05K 7/00 | (2006.01) |
| H05K 7/20 | (2006.01) |

(52) U.S. Cl.
CPC ..... *H05K 7/20836* (2013.01); *H05K 7/20718* (2013.01)

(58) Field of Classification Search
CPC .......... H05K 7/20836; H05K 7/20718; H05K 7/20709; H05K 7/20754; H05K 7/20727; H05K 7/20736; H05K 7/20745
See application file for complete search history.

(56) References Cited

U.S. PATENT DOCUMENTS

| 8,233,644 | B2 | 7/2012 | DeMoss | |
| 8,619,426 | B2 | 12/2013 | Chamseddine et al. | |
| 8,893,980 | B2 * | 11/2014 | Scott | F24F 11/77 236/97 |
| 10,310,573 | B2 | 6/2019 | Montero | |
| 2006/0103334 | A1 * | 5/2006 | Abali | F04D 25/166 318/67 |
| 2007/0124574 | A1 * | 5/2007 | Goldberg | G06F 1/206 713/100 |
| 2009/0304199 | A1 * | 12/2009 | DeMoss | H05K 7/20209 381/71.1 |
| 2012/0078420 | A1 * | 3/2012 | Jensen | G06F 1/206 700/275 |
| 2012/0083925 | A1 * | 4/2012 | Scott | F24F 11/77 700/275 |
| 2013/0037620 | A1 * | 2/2013 | Aryanfar | G06F 1/20 454/256 |
| 2013/0343916 | A1 | 12/2013 | Curtis et al. | |
| 2017/0336839 | A1 * | 11/2017 | Ho | G06F 1/20 |

* cited by examiner

*Primary Examiner* — Anthony M Haughton
(74) *Attorney, Agent, or Firm* — Larson Newman, LLP

(57) ABSTRACT

An information handling system includes at least one air mover configured to cool a device of the information handling system. An air mover control system may control a speed of the air mover at or below a first air mover target speed to maintain a temperature of the device at or below a target temperature that includes a first target temperature and a second target temperature. If the air mover speed is greater than a second air mover target speed and the temperature of the device is greater than the first target temperature, then the target temperature may be set to the second target temperature. If the air mover speed is less than the first air mover target speed and the temperature of the device is less than the first target temperature, then the target temperature may be set to the first target temperature.

20 Claims, 4 Drawing Sheets

THERMAL CONTROL WITH OPERATING POINT SHIFT FOR ACOUSTIC OPTIMIZATION

FIELD OF THE DISCLOSURE

The present disclosure generally relates to information handling systems, and more particularly relates to thermal control with operating point shift for acoustic optimization.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes at least one air mover configured to cool a device of the information handling system. An air mover control system may control a speed of the air mover at or below a first air mover target speed to maintain a temperature of the device at or below a target temperature that includes a first target temperature and a second target temperature. If the air mover speed is greater than a second air mover target speed and the temperature of the device is greater than the first target temperature, then the target temperature may be set to the second target temperature. If the air mover speed is less than the first air mover target speed and the temperature of the device is less than the first target temperature, then the target temperature may be set to the first target temperature.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
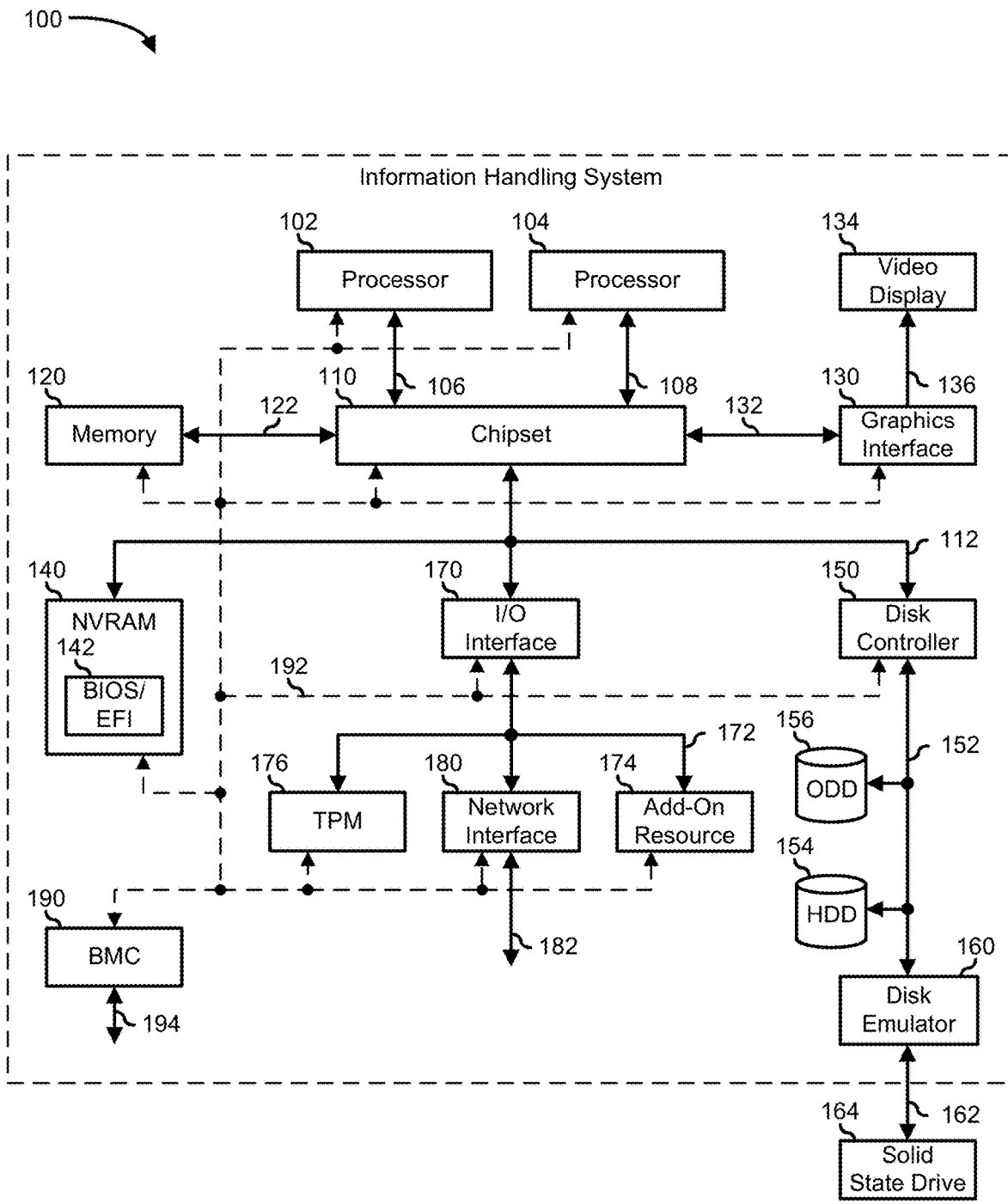
FIG. 1 is a block diagram illustrating an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive 156, a disk emulator 160 connected to a solid-state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manage the data flow between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104.

Memory 120 is connected to chipset 110 via a memory interface 122. An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like.

Memory 120 may further represent various combinations of memory types, such as Dynamic Random-Access Memory (DRAM) DIMMs, Static Random-Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132 and provides a video display output 136 to a video display 134. An example of a graphics interface 132 includes a Peripheral Component Interconnect-Express (PCIe) interface and graphics adapter 130 can include a four-lane (×4) PCIe adapter, an eight-lane (×8) PCIe adapter, a 16-lane (×16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 134 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including a PCIe interface, an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disk controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits SSD 164 to be connected to information handling system 100 via an external interface 162. An example of external interface 162 includes a USB interface, an institute of electrical and electronics engineers (IEEE) 1394 (Firewire) interface, a proprietary interface, or a combination thereof. Alternatively, SSD 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112 or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral interface 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on a separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface 180 includes a network channel 182 that provides an interface to devices that are external to information handling system 100. In a particular embodiment, network channel 182 is of a different type than peripheral interface 172, and network interface 180 translates information from a format suitable to the peripheral channel to a format suitable to external devices.

In a particular embodiment, network interface 180 includes a NIC or host bus adapter (HBA), and an example of network channel 182 includes an InfiniBand channel, a Fibre Channel, a Gigabit Ethernet channel, proprietary channel architecture, or a combination thereof. In another embodiment, network interface 180 includes a wireless communication interface, and network channel 182 includes a Wi-Fi channel, a near-field communication (NFC) channel, a Bluetooth® or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out-of-band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like. The term BMC is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell® Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a PCIe interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics adapter 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) associated with BMC 190, an interface defined by the Distributed Management Taskforce (DMTF) (such as a Web Services Management (WSMan) interface, a Management Component Transport Protocol (MCTP) or, a Redfish® interface), various vendor-defined interfaces (such as a Dell EMC Remote Access Controller Administrator (RACADM) utility, a Dell EMC OpenManage Enterprise, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100 or is integrated onto another element of the information handling system such as chipset 110, or another suitable element, as needed or desired. As such, BMC 190 can be part of an integrated circuit or a chipset within information handling system 100. An example of BMC 190 includes an iDRAC or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Information handling system 100 can include additional components and additional busses, not shown for clarity. For example, information handling system 100 can include multiple processor cores, audio devices, and the like. While a particular arrangement of bus technologies and interconnections is illustrated for the purpose of example, one of skill will appreciate that the techniques disclosed herein are applicable to other system architectures. Information handling system 100 can include multiple central processing units (CPUs) and redundant bus controllers. One or more components can be integrated together. Information handling system 100 can include additional buses and bus protocols, for example, I2C and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smartphone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as processor 102, a programmable logic array (PLA), an embedded device such as a System-on-a-Chip (SoC), or other control logic hardware. Information handling system 100 can also include one or more computer-readable media for storing machine-executable code, such as software or data.

One or more cooling fans are typically employed within a chassis of an information handling system to cool system components or devices. Thermally demanding compute subsystems or devices have cooling requirements that are typically balanced against fan speed, system acoustic limits, and optimal performance. For example, non-volatile memory express (NVMe) storage devices offer increased performance over HDD and SATA SSD storage devices but at an increased power and thermal challenge. A solution that balances acoustic limits or fan speeds while optimizing performance, preventing thermal shutdown without sacrificing reliability may be desirable. Such a solution is presented in this disclosure that includes a system and method using a cooling algorithm for optimizing subsystem performance and/or thermal and system acoustics management.

Figure 2:
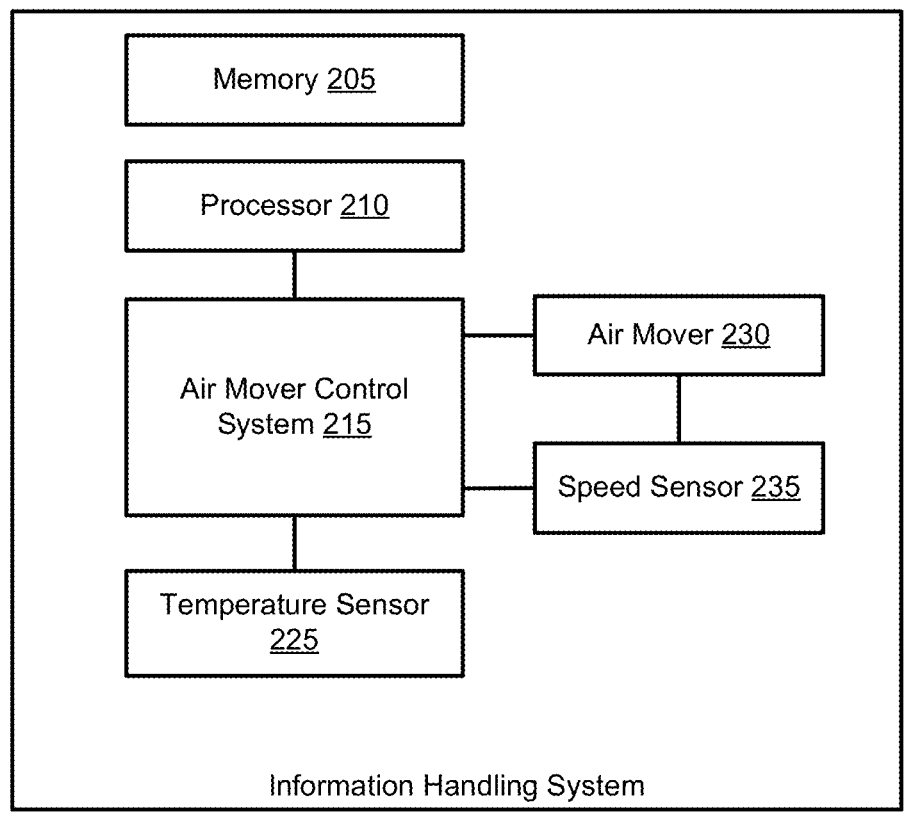
FIG. 2 is a block diagram illustrating an example of an information handling system using thermal control with operating point shift for acoustic optimization, according to an embodiment of the present disclosure.

FIG. 2 shows an information handling system 200 where thermal control with an operating point shift for acoustic optimization may be implemented. The thermal control may be implemented for an NVME storage device and/or other devices or components of information handling system 200. Information handling system 200 includes a memory 205, a processor 210, an air mover control system 215, a temperature sensor 225, an air mover 230, and a speed sensor 235. These components of information handling system 200 may be implemented in hardware, software, firmware, or any combination thereof. Also, the components shown are not drawn to scale and information handling system 200 may include additional or fewer components. In addition, connections between the components may be omitted for descriptive clarity.

Processor 210, which is similar to processors 103 or 104 of FIG. 1, may include any system, device, or apparatus operable to interpret and/or execute program instructions and/or process data, and may include without limitation a microprocessor, microcontroller, digital signal processor (DSP), application-specific integrated circuit (ASIC), or any other digital or analog circuitry configured to interpret and/or execute program instructions and/or process data. In some embodiments, processor 210 may interpret and/or execute program instructions and/or process data stored in memory 205 and/or another component of information handling system 200. Memory 205 may be communicatively coupled to processor 210 and may include any system, device, or apparatus operable to retain program instructions or data for a period of time. Memory 205 may be communicatively coupled to processor 210 and may include any system, device, or apparatus operable to retain program instructions or data for a period of time. Memory 205 may include a random-access memory (RAM), electrically erasable programmable read-only memory (EEPROM), a personal computer memory card international association (PCM-CIA) card, flash memory, magnetic storage, optomagnetic storage, or any suitable selection and/or array of volatile or non-volatile memory that retains data after power to information handling system 200 is turned off.

Air mover 230 may be communicatively coupled to air mover control system 215 and may include any mechanical or electro-mechanical system, apparatus, or device operable to move air and/or other gasses. In some embodiments, air mover 230 may include a fan, such as a rotating arrangement of vanes or blades which act on the air. In other embodiment, air mover 230 may include a mover, such as a centrifugal fan that employs rotating impellers to accelerate air received at its intake and change the direction of the airflow. In these and other embodiments, rotating and other moving components of air mover 230 may be driven by a motor. The rotational speed of air mover 230 may be controlled by the air mover control signal communicated from air mover control system 215.

In operation, air mover 230 may cool resources, system and/or devices of information handling system 200 by drawing cool air into an enclosure housing the information handling system from the outside the enclosure, expel warm air from inside the enclosure to the outside of such enclosure, and/or move air across one or more heatsinks internal to the enclosure. Air mover control system 215 may be configured to implement a closed-loop cooling algorithm with operating point shift for acoustic optimization. In particular, air mover control system 215 may operate in a closed-loop thermal control system that ramps air movers in reaction to thermal events. If the air movers exceed a predetermined acoustic limit which is correlated to air mover speed and the active device, such as the NVMe SSD, is over its maximum performance temperature target, then the algorithm shifts the target temperature to allow thermal performance throttling. This allows for a predetermined performance drop on the active device while the system is operating above the acoustic limit or exceeded the revolutions per minute (RPM) limit of the air mover. If the speed of the air mover ramps down and the device has cooled below the initial target temperature then the algorithm resets to a minimum performance target.

Air mover control system 215 which includes an air mover speed controller may be configured to monitor the temperature of the device and the air mover speed. If the air mover speed is greater than a second air mover target speed and the temperature of the device is greater than the first target temperature then setting a target temperature to a second target temperature. If the air mover speed is less than the first air mover target speed and the current temperature of the device is less than the first target temperature, then setting the target temperature to the first target temperature. If the air mover speed is greater than the second air mover target speed and the current temperature of the device is less than or equal to the first target temperature then keep the target temperature at the current setting. If the air mover speed is less than the first air mover target speed and the current temperature of the device is greater than the first target temperature, then keep the target temperature at the current setting. Air mover control system 215 may be configured to increase or decrease the air mover speed based on the target temperature. For example, wherein the first air mover speed target is less than the second air mover speed target, the air mover speed may be increased from the first air mover speed target to the second air mover speed target. The air mover speed may also be decreased from the second air mover speed target to the first air mover speed target.

A temperature sensor 225 may be any system, device, or apparatus such as a thermometer, thermistor, etc. configured to communicate a signal to air mover speed controller indicative of a temperature within information handling system 200. Speed sensor 235 may be communicatively coupled to air mover 230 and may include any system, device, or apparatus capable of sensing the speed of a rotational component of air mover 230 and communicating a signal indicative of such sensed speed to air mover control system 215. The rotational component of air mover 230 includes a fan rotor, impeller, motor, etc. In some embodiment, speed sensor 235 may include a Hall effect sensor such as a transducer that varies its output voltage in response to a magnetic field, such magnetic created by a magnetic element present in air mover 230.

FIG. 2 depicts only one each of air mover control system 215, air mover 230, speed sensor 235, and temperature sensor 225. However, it is noted that information handling system 200 may include two or more air movers 230 and each such air mover 230 may have a dedicated respective air mover control system 215 and/or a dedicated respective speed sensor 235. It is further noted that an air mover control system 215 may receive temperature signals from one or more temperature sensors 225 and that a single temperature sensor 225 may communicate temperature signals to one or more air mover control systems 215.

Those of ordinary skill in the art will appreciate that the configuration, hardware, and/or software components of information handling system 200 depicted in FIG. 2 may vary. For example, the illustrative components within information handling system 200 are not intended to be exhaustive, but rather are representative to highlight components that can be utilized to implement aspects of the present disclosure. For example, other devices and/or components may be used in addition to or in place of the devices/components depicted. The depicted example does not convey or imply any architectural or other limitations with respect to the presently described embodiments and/or the general disclosure. In the discussion of the figures, reference may also be made to components illustrated in other figures for continuity of the description.

Figure 3:
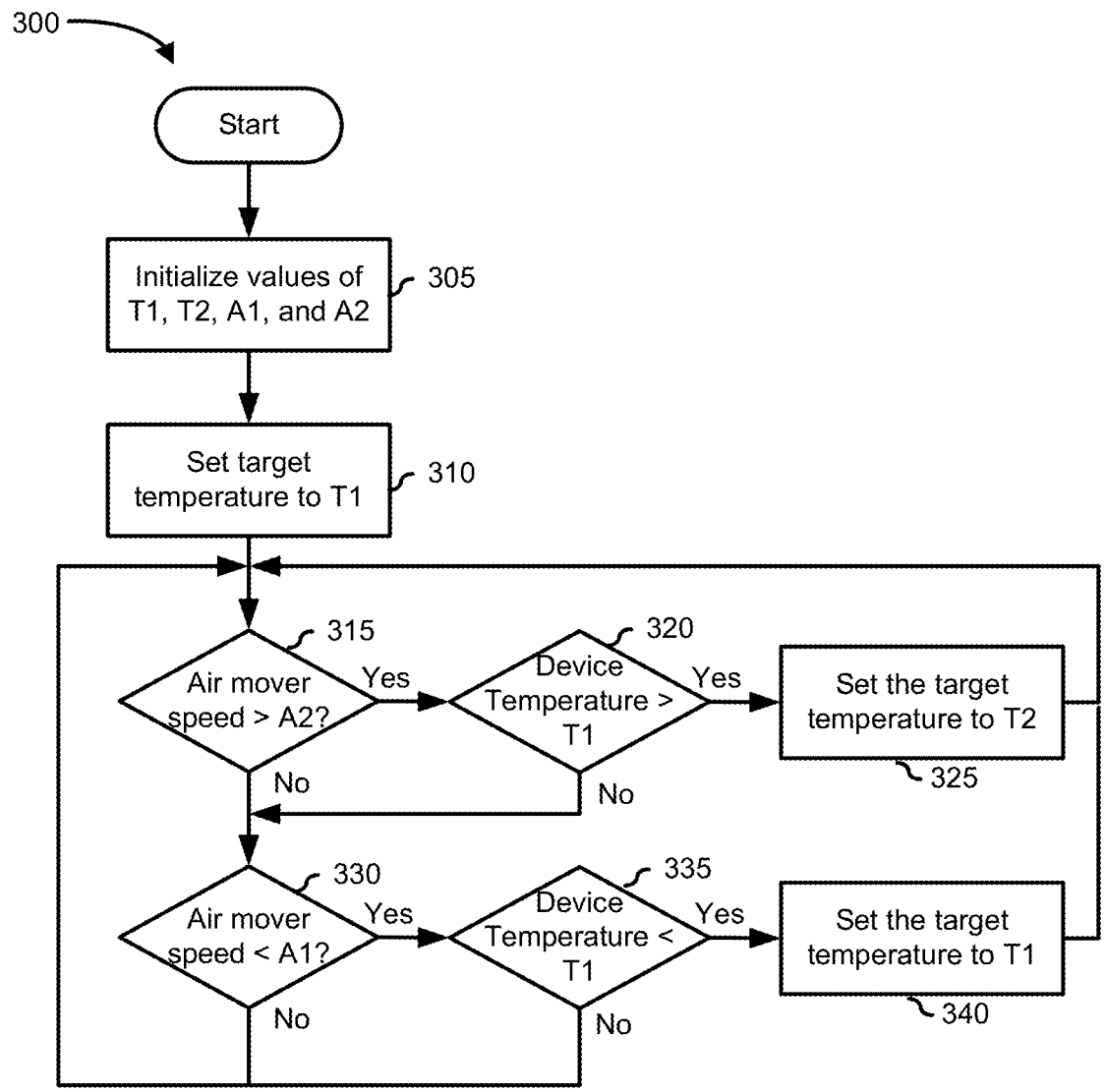
FIG. 3 is a flowchart illustrating an example of a method for thermal control with operating point shift for acoustic optimization, according to an embodiment of the present disclosure.

FIG. 3 shows a flowchart of an example method 300 for thermal control with operating point shift for acoustic optimization. Method 300 may be performed by one or more components of information handling system 200 such as air mover control system 215 of FIG. 2. While embodiments of the present disclosure are described in terms of information handling system 200 of FIG. 2, it should be recognized that other systems may be utilized to perform the described method. One of skill in the art will appreciate that this flowchart explains a typical example, which can be extended to advanced applications or services in practice.

Method 300 typically starts at block 305 where the method initializes values for a first target temperature (T1), a second target temperature (T2), a first air mover target speed (A1), and a second air mover target speed (A2). A target temperature, a current temperature, and a current air mover speed may also be initialized to zero. The temperature may be specified in Celsius, Fahrenheit, Kelvin, etc. The air mover speed may be rotational speed or speed of revolutions specified as RPM, cycles per second (CPS), radians per second (rad/s), etc. The air mover speed may be based upon various factors such as the size of the air mover. Acoustic noise generated by the air mover may be proportional to the air mover speed. For example, the faster the air mover speed is, the noisier the air mover. Accordingly, in another embodiment, A1 may indicate a first acoustic limit and A2 may indicate a second acoustic limit.

An information handling system typically has a collection of sensors that automatically track the temperature of the information handling system and its' devices or components. Target temperatures may be used in tracking the temperature. The first target temperature indicates a composite temperature threshold field value wherein remediation is recommended, such as additional cooling or workload reduction, when reached. The method should strive to maintain the temperature below the first target temperature. The device operates at full performance when its current temperature is below the first target temperature.

The second target temperature indicates a composite temperature threshold field value wherein further remediation is recommended to prevent temperature to exceed the second target temperature. The device may reliably continue with throttled operation below the second target temperature without the possibility of data loss, automatic device shutdown, or permanent damage. The device operates at throttled performance when the current temperature of the device is above the first target temperature which allows for minimum performance. The device operates at throttled performance when its current temperature is below the second target temperature and above the first target temperature.

The first air mover target speed indicates an air mover speed threshold field value to prevent the device or component from exceeding the target temperature. That is, the first air mover speed may keep the temperature of the device or component at or below a target temperature. The first air mover target speed may be faster than the current air mover speed to provide additional cooling. The first air mover speed may be adjusted using hysteresis such as first air mover target speed=target air mover speed−hysteresis, wherein hysteresis may be a predetermined value to avoid rapid cycling. The second air mover target speed indicates an air mover speed threshold field to prevent the device to exceed a particular target temperature. The second air mover target speed may be faster than the first air mover speed. The second air mover target speed may keep the target temperature at or below the second target temperature.

At block 310, the method sets the target temperature to the first target temperature and proceeds to decision block 315 where the method determines whether the current air mover speed is greater than the second air mover target speed. If the current air mover speed is greater than the second air mover target speed, then the "YES" branch is taken and the method proceeds to decision block 320. If the current air mover speed is not greater than the second air mover target speed, then the "NO" branch is taken and the method proceeds to decision block 330.

At decision block 320, the method determines whether the current temperature of the device is greater than the first target temperature. If the current temperature of the device is greater than the first target temperature, then the "YES" branch is taken and the method proceeds to block 325. If the current temperature of the device is not greater than the first target temperature, then the "NO" branch is taken and the method proceeds to decision block 330. At block 325, the method sets the target temperature to the second target temperature and loops to decision block 315.

At decision block 330, the method determines whether the current air mover speed is less than the first air mover target speed. If the current air mover speed is less than the first air mover target speed, then the "YES" branch is taken and the method proceeds to decision block 335. At decision block 335, the method determines whether the current temperature of the device is less than the first target temperature. If the current temperature of the device is less than the first target temperature, then the "YES" branch is taken and the method proceeds to block 340. If the current temperature of the device is not less than the first target temperature, then the "NO" branch is taken and the method proceeds to decision block 315. At block 340, the method sets the target temperature to the first target temperature and loops back to decision block 315.

Accordingly, the method may utilize the acoustic limits in determining whether to shift the target temperature. For example, if the current acoustic level of the device in operation is greater than the second acoustic limit and the temperature of the device is greater than the first target temperature then the target temperature is set to the second target temperature. If the current acoustic level of the device in operation is less than the first acoustic limit and the temperature of the device is less than the first target temperature then set the target temperature to the first target temperature. If the current acoustic level of the device in operation is greater than the second acoustic limit and the temperature of the device is less than or equal to the first target temperature then the target temperature is kept to the current setting. If the current acoustic level of the device in operation is less than the first acoustic limit and the temperature of the device is greater than the first target temperature then the target temperature is kept to the current setting.

Figure 4:
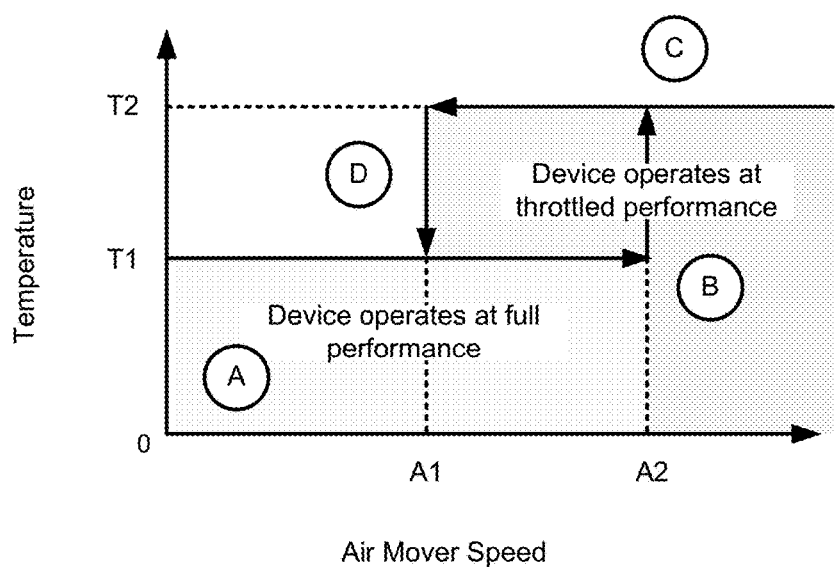
FIG. 4 is a graph illustrating an example of a thermal control with operating point shift for acoustic optimization, according to an embodiment of the present disclosure.

FIG. 4 shows a graph 400 that depicts a thermal control with operating point shift for acoustic optimization. In particular, graph 400 illustrates a target shift feature based on where the cooling mechanisms are operating to balance the acoustic and performance challenges of a device in an information handling system. Graph 400 shows a relationship between temperature and air mover speed and includes ambient temperatures on the Y-axis and air mover speeds on the X-axis. In one embodiment, the Y-axis includes a first target temperature and a second target temperature. The X-axis includes a first air mover target speed and a second target speed.

Acoustics which is typically expressed in decibels is one of the performance attributes considered with or possibly as a trade-off against other performance areas like temperature. Higher-powered devices generally require additional cooling, typically by one or more air movers. However, air movers are generally one of the sources of noise in an information handling system. Typically, as the speed of the air mover increases the acoustic also increases. Conversely, as the speed of the air mover decreases the acoustic also decreases. Thus, there is a correlation between the air mover speed and the acoustic level. Accordingly, instead of a first air mover target speed and a second air mover target speed, the X-axis may include a first acoustic target or limit and a second acoustic target or limit.

A closed-loop thermal control algorithm is implemented to maintain the device temperature at or below a target temperature. The target temperature may be based on an air mover speed limit or an acoustic limit. The air mover speed limit includes a first air mover target speed and a second air mover target speed. The acoustic limit includes a first acoustic limit and a second acoustic limit. The air mover speed is controlled to maintain the device temperature at or below the target temperature. The target temperature shifts based on the air mover speed. The device operates at a full performance at or below the first target temperature. As the air mover target speed is reached, the control target shifts to the higher limit, and the performance of the device may throttle to maintain its internal temperature limits.

FIG. 4 is annotated with a series of letters A-D. Each of these letters represents a stage of one or more operations. Although these stages are ordered for this example, the stages illustrate one example to aid in understanding this disclosure and should not be used to limit the claims. Subject matter falling within the scope of the claims can vary with respect to the order of the operations.

At or below a first target temperature (T1) at stage A, wherein the current air mover speed is below the first air mover target speed (A1), the device operates at full performance. As the second air mover target speed (A2) is reached at stage B, the target temperature is set to the second target temperature (T2). At stage C, the device operates at a throttled performance until the current temperature of the device reaches the first target temperature or lower at stage D. At this point, the target temperature is set to the first target temperature. In this example, T2 is greater than T1 and A2 is greater than A1.

Although FIG. 3 shows example blocks of method 300 in some implementation, method 300 may include additional blocks, fewer blocks, different blocks, or differently arranged blocks than those depicted in FIG. 3. Additionally, or alternatively, two or more of the blocks of method 300 may be performed in parallel. For example, block 305 and block 310 of method 300 may be performed in parallel.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions or receives and executes instructions responsive to a propagated signal; so that a device connected to a network can communicate voice, video, or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or another storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents but also equivalent structures.

What is claimed is:

1. A method comprising:
   maintaining, by a processor, a device at or below a target temperature based on an acoustic limit that includes a first acoustic limit and a second acoustic limit, wherein the target temperature includes a first target temperature and a second target temperature;
   shifting the target temperature based on whether an operation of the device is within the acoustic limit, wherein the shifting the target temperature further includes:
   if an acoustic level of the device during the operation is greater than the second acoustic limit and a temperature of the device is greater than the first target temperature then setting the target temperature to the second target temperature; and
   if the acoustic level of the device during the operation is less than the first acoustic limit and the temperature of the device is less than the first target temperature then setting the target temperature to the first target temperature.

2. The method of claim 1, wherein setting the target temperature to the second target temperature allows throttling of the operation of the device.

3. The method of claim 1, wherein setting the target temperature to the first target temperature allows for a normal operation of the device.

4. The method of claim 1, further comprising increasing the acoustic limit based on the target temperature.

5. The method of claim 1, further comprising decreasing the acoustic limit based on the target temperature.

6. The method of claim 1, wherein the shifting of the target temperature further comprising if the acoustic level of the device during the operation is greater than the second acoustic limit and temperature of the device less than or equal to the first target temperature then keep the target temperature.

7. The method of claim 1, wherein the shifting of the target temperature further comprising if the acoustic level of the device during the operation is then than the first acoustic limit and temperature of the device greater to the first target temperature then keep the target temperature.

8. An information handling system, comprising:
at least one air mover configured to cool a device of the information handling system; and
an air mover control system configured to:
control a speed of the air mover at or below a first air mover target speed to maintain a temperature of the device at or below a target temperature that includes a first target temperature and a second target temperature, wherein the control of the speed further includes:
monitoring the temperature of the device and the air mover speed;
if the air mover speed is greater than a second air mover target speed and the temperature of the device is greater than the first target temperature then setting the target temperature to the second target temperature; and
if the air mover speed is less than the first air mover target speed and the temperature of the device is less than the first target temperature, then setting the target temperature to the first target temperature.

9. The information handling system of claim 8, wherein when the target temperature is set to the second target temperature allows for throttled operation of the device.

10. The information handling system of claim 8, wherein when the target temperature is set to the first target temperature allows for full operation of the device.

11. The information handling system of claim 8, wherein the air mover control system is further configured to increase the air mover speed based on the target temperature.

12. The information handling system of claim 8, wherein the air mover control system is further configured to decrease the air mover speed based on the target temperature.

13. The information handling system of claim 8, wherein the control of the air mover speed further comprising if the air mover speed is greater than the second air mover target speed and the temperature of the device is less than or equal to the first target temperature then keep the target temperature.

14. A non-transitory computer-readable medium including code that when executed performs a method, the method comprising:
maintaining operation of a device at or below a target temperature that includes a first target temperature or a second target temperature;
controlling a speed of an air mover at or below a first air mover target speed to maintain a temperature of the device at or below the first target temperature;
if the air mover speed is greater than a second air mover target speed and the temperature of the device is greater than the first target temperature, then setting the target temperature to the second target temperature; and
if the air mover speed is less than the first air mover target speed and the temperature of the device is less than the first target temperature, then setting the target temperature to the first target temperature.

15. The method of claim 14, wherein the setting of the target temperature to the second target temperature allows throttling the operation of the device.

16. The method of claim 14, wherein the setting of the target temperature to the first target temperature allows for normal operation of the device.

17. The method of claim 14, further comprising increasing the air mover speed based on the target temperature.

18. The method of claim 14, further comprising decreasing the air mover speed based on the target temperature.

19. The method of claim 14, wherein the controlling of the air mover speed further comprising if the air mover speed is greater than the second air mover target speed and the temperature of the device is less than or equal to the first target temperature then keep the target temperature.

20. The method of claim 14, wherein the controlling of the air mover speed further comprising if the air mover speed is greater than the second air mover target speed and the temperature of the device is less than or equal to the first target temperature then keep the target temperature.

* * * * *